United States Patent [19]

Ohkawa

[11] Patent Number: 5,117,188
[45] Date of Patent: May 26, 1992

[54] QUASI-OPEN MAGNET CONFIGURATION FOR USE IN MAGNETIC RESONANCE IMAGING

[75] Inventor: Tihiro Ohkawa, La Jolla, Calif.

[73] Assignee: General Atomics, San Diego, Calif.

[21] Appl. No.: 605,563

[22] Filed: Oct. 29, 1990

[51] Int. Cl.⁵ .............................................. G01R 33/20
[52] U.S. Cl. ................................... 324/318; 324/322; 335/296
[58] Field of Search ................. 335/296; 324/300, 307, 324/309, 318, 319, 320, 322; 128/653 R, 653 A, 653 SC

[56] References Cited

U.S. PATENT DOCUMENTS

| | | | |
|---|---|---|---|
| 3,018,422 | 1/1962 | Seaton | 317/201 |
| 3,223,897 | 12/1965 | Sullivan | 317/158 |
| 3,417,356 | 12/1968 | Tschopp | 335/298 |
| 3,671,855 | 6/1972 | Bozanic et al. | 324/315 |
| 3,740,641 | 6/1973 | Hwang et al. | 324/316 |
| 3,924,211 | 12/1975 | Ioffe et al. | 335/284 |
| 4,093,912 | 6/1978 | Double et al. | 324/0.5 MA |
| 4,122,386 | 10/1978 | Tomita et al. | 0.5 H/ |
| 4,656,449 | 4/1987 | Mallard et al. | 335/297 |
| 4,679,022 | 7/1987 | Miyamoto et al. | 335/296 |

Primary Examiner—Michael J. Tokar
Attorney, Agent, or Firm—Nydegger & Associates

[57] ABSTRACT

A magnet system used for magnetic resonance imaging comprises a magnetic coil energizable to establish a magnetic field and a contoured insert of ferromagnetic material positioned within the coil. The insert is substantially dish-shaped and has a top surface contoured with radial transitions from a flat portion, to a concave portion, to a convex portion, to provide a uniform magnetic field within a target zone located at the center of the front surface. A method is also disclosed for determining the proper contour to achieve high uniform magnetic field within the target zone.

18 Claims, 2 Drawing Sheets

QUASI-OPEN MAGNET CONFIGURATION FOR USE IN MAGNETIC RESONANCE IMAGING

FIELD OF THE INVENTION

This invention relates generally to magnet systems for generating a uniform magnetic field. More specifically, the invention relates to a magnet system in which the magnetic field generating elements all lie below or to one side of a patient. The present invention is particularly, though not exclusively, useful for use in magnetic resonance imaging systems.

BACKGROUND OF THE INVENTION

In the past, there have been many various types of magnet systems designed to provide a uniform magnetic field within a predetermined volume of space. One such type of magnet system is a magnetic resonance imaging (MRI) system which is typically used for spectroscopy on patients to detect abnormalities in living human cell tissue. Importantly, it must be possible to effectively position a patient in the uniform magnetic field. Accordingly, different types of MRI system designs have been used to establish a uniform field within a specified volume (e.g. a sphere) of sufficient size to allow a patient to be positioned in the field. To accomplish this, some earlier MRI systems have incorporated a pair of parallel magnetic pole plates to establish the field and have spaced the plates far enough apart to allow a patient to be positioned between them. In another configuration, other earlier MRI systems have incorporated a hollow cylindrical magnet system with magnetic coils surrounding the hollow interior of a cylinder into which the patient is placed. Both of these MRI system structures are "closed" in the sense that when a patient is positioned within the useful magnetic field, the patient is "closed" in. In other words, the structures are such that the patient's whole body must be positioned inside a structurally confined space, with magnet system components located above, below, and to the sides of the patient.

While such systems may provide a satisfactory uniform magnetic field, they do so with some disadvantages. For one thing, many patients develop claustrophobic reactions resulting from closed space structures. Another disadvantage is that during the time the patient is positioned inside such MRI systems, access to the patient is limited. There is little or no ability for physicians and others to perform other diagnostic procedures or operations on the patient while the patient undergoes magnetic resonance imaging.

Another disadvantage of conventional MRI systems is that they require support of the heavy magnets and components needed to generate magnetic field uniformities at the intensity required for useful spectroscopy. Structural support for magnet systems must be of sufficient size and strength to provide an adequate margin of safety for the patient, who may be positioned beneath heavy components. Unfortunately, extra precautionary design measures to ensure safety entail added material, manufacturing, and operating costs to MRI systems.

Accordingly, the present invention recognizes the need for a magnetic resonance imaging system which has a substantially open design that permits increased accessibility to the patient and eliminates heavy system components from being suspended above the patient. The present invention accomplishes this by providing a magnet system in which the magnetic field generating components are located substantially beneath the patient.

Accordingly, it is an object of the present invention to provide a substantially open design magnet system for generating a uniform magnetic field. Another object of the present invention is to provide a magnet system which allows a uniform magnetic field to be produced in a volume located substantially to one side of the magnetic field generating source. It is yet another object of the present invention to provide a magnet system which provides a uniform magnetic field sufficient for magnetic resonance imaging which allows easy access to patients during imaging. Still another object of the present invention is to provide a magnet system which accommodates patients without causing discomfort. Another object of the present invention is to provide a magnet system which is convenient and reliable in use, and cost-effective in manufacture.

SUMMARY OF THE INVENTION

A preferred embodiment of the substantially open magnet system comprises an annular magnetic coil, and a contoured iron insert positioned within the coil, to produce a highly uniform magnetic field or target zone directly above the iron insert. The iron insert is dish-shaped and substantially circular and has a contoured top or front surface, a contoured side surface, and a contoured bottom surface. The contoured surfaces are shaped and positioned relative to the magnetic coil to generate a uniform magnetic field region which is located substantially above the top surface and centered about a central longitudinal axis that is substantially perpendicular to the top surface of the insert or dish. Stated from another perspective, the dish lies in a transverse reference plane which is perpendicular to the central longitudinal axis. The coil is centered on the central axis and is slightly displaced from the transverse reference plane of the dish to generate a magnetic field whose midplane is located parallel to the transverse reference plane of the dish.

In an axisymmetrical embodiment of the present invention, the top surface of the insert is defined by three identifiable regions. The first of these regions is a circular flat portion which is centered about the central longitudinal axis, and which extends to an outer peripheral edge. Extending radially from the flat top surface portion and adjacent the outer peripheral edge of the central circular flat portion is a concave annular top surface portion which constitutes the second region. This concave annular top surface portion also has an outer peripheral edge along which is disposed a convex annular portion that constitutes the third region and terminates at an outer edge of the top surface. This outer edge of the top surface establishes the periphery of the dish and is positioned adjacent an inside edge of the annular coil.

The bottom surface of the dish is formed with a circular flat bottom surface portion which is centered about the central longitudinal axis and is substantially parallel to the circular flat portion of the top surface. This flat bottom surface portion gradually transitions into a contiguous radially-extending convex bottom surface portion which terminates at the periphery of the dish adjacent the inside bottom edge of the coil. When the coil is energized, a uniform magnetic field region or target zone is generated which is substantially above the circular flat top surface and centered about the central longitudinal axis of the dish.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
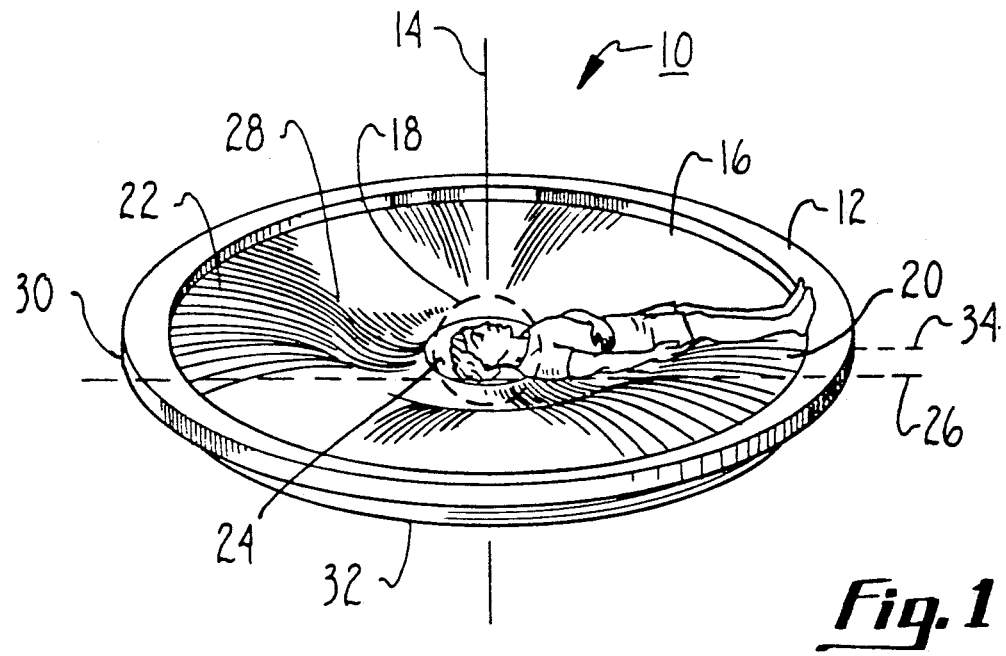
FIG. 1 is a perspective view of the magnet system in accordance with the present invention.
Figure 2:
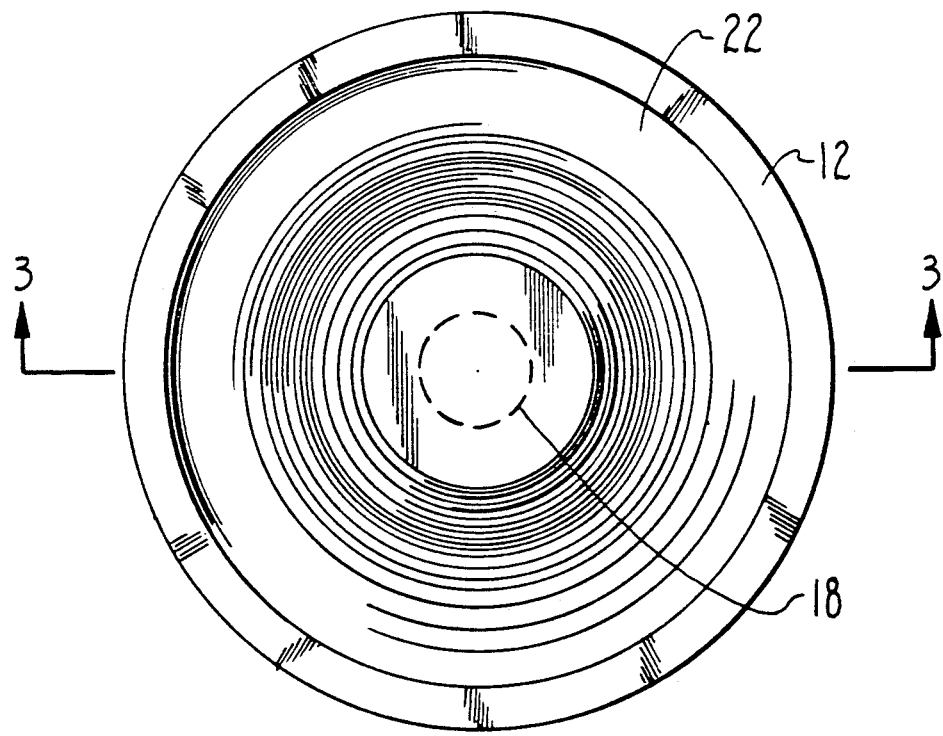
FIG. 2 is a top view of the magnet system in accordance with the present invention.

Referring initially to FIGS. 1 and 2, there is shown one embodiment of a magnet system according to the present invention, generally designated 10, in its intended environment. In particular, magnet system 10 comprises an annular magnetic coil 12, centered about a central longitudinal axis 14. Coil 12 defines and lies substantially in a transverse magnetic midplane 34 which is perpendicular to the axis 14. As a magnetic field source element, coil 12 may include single or multiple windings generally about axis 14 which can be energized by means well-known in the art (not shown) to generate a magnetic flux field inside the interior 16 of coil 12. Advantageously, coil 12 can be made of any material suitable for generating a magnetic field of sufficient strength for use in magnetic resonance imaging. It has been determined that superconducting coils can effectively be used under conventional techniques to accomplish this with the present invention. The amp-turn requirements of the coil are similar to those of a whole body type closed MRI system. For purposes of the present invention, it has been found that two MA-turns are required to produce a uniform magnetic field in the central sphere, or target zone, 18, with an intensity of one half (0.5) tesla. In a preferred embodiment, coil 12 has a radius of approximately two and two tenths (2.2) meters. With this configuration, sphere 18 having a diameter of approximately thirty (30) centimeters is generated and located at the center of coil 12 about central axis 14. A magnetic field which has a uniformity of approximately thirty-six (36) parts per million rms, with a peak-to-peak variation of one hundred twenty (120) parts per million, is desirable for use in magnetic resonance imaging.

Figure 3:
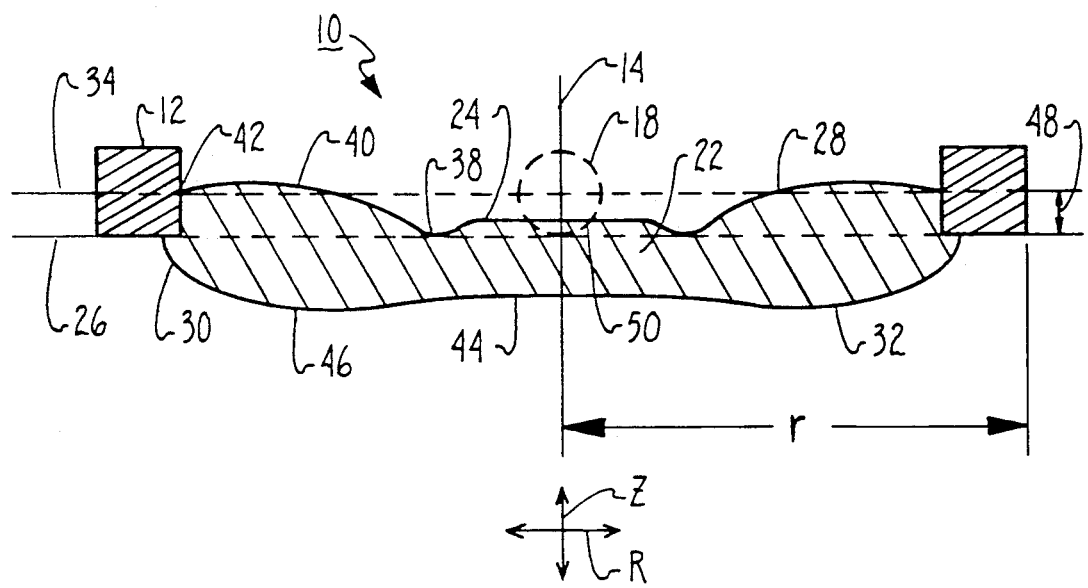
FIG. 3 is a side cross-sectional view of the magnet system taken along the line 3—3 of FIG. 2.

As further shown in FIGS. 1 and 2, a contoured dish or insert 22 is positioned in interior area 16 of coil 12. In accordance with the present invention, insert 22 is made of a ferromagnetic material, such as iron, and is substantially in the shape of a circular dish which lies substantially in a transverse reference plane 26. As shown, reference plane 26 is distanced from and parallel to a magnetic field midplane 34. Both reference plane 26 and midplane 34 are perpendicular to central longitudinal axis 14. Dish 22 has a top or upper surface 28, an end or side surface 30, and a bottom surface 32. Formed on top surface 28 is a substantially flat circular top surface portion 24, which is located in the center of the upper surface of dish-shaped insert 22. As best seen in FIG. 3, central flat portion 24 is parallel to transverse reference plane 26. Target zone 18 is located substantially above central flat portion 24. A patient 20 may thus be advantageously oriented substantially parallel to midplane 34, within target zone 18.

Still referring to FIG. 3, there is shown a cross section of magnet system 10 further showing in detail the contour and placement of dish 22. Dish 22 is inserted in the interior 16 of coil 12 to attain a uniform magnetic flux field within target zone 18. Central midplane 34 of coil 12 is located a predetermined distance 48 above reference plane 26 of dish 22. In the embodiment shown, to generate a spherical target zone 18 of approximately thirty (30) centimeters in diameter, iron insert dish 22 has an outer radius similar to the inner radius of coil 12 of approximately two and two tenths (2.2) meters. Additionally, insert dish 22 has a thickness of approximately one half (0.5) meter. Thus, the radius of dish 22 is approximately four (4) times its thickness.

With respect to the contour of dish 22, flat circular portion 24 is substantially parallel to reference plane 26 and centered about longitudinal axis 14. Adjacent the outer peripheral edge of flat top surface portion 24 is an annular concave surface portion 38. Immediately adjacent the outer edge of the annular concave portion 38, there is formed an annular convex surface portion 40. Convex surface portion 40 tends to gradually flatten out and terminate at upper outer edge periphery 42 to abut the inner edge of coil 12.

Bottom surface 32 of dish 22 is formed with a generally flat central surface portion 44 which is substantially parallel to flat circular portion 24 and centered about axis 14. Flat central surface portion 44 gradually transitions into contiguous gradual bottom convex portion 46 which terminates at lower outer edge periphery 43 to abut the bottom edge of coil 12.

In order to achieve the desired homogenous field within target sphere 18, it has been found that transverse magnetic field midplane 34 of coil 12 should be set off a distance 48 from reference plane 26 as shown in FIG. 3. Although there is some protrusion 50 of iron dish 22 above reference plane 26 into target zone 18, the protrusion 50 is relatively small. Thus, access to the substantially open target zone 18 is readily achievable. Since only a small portion of target zone 18 is not available, the system according to the present invention can be characterized as "quasi-open", or providing substantially open access to the target zone 18. In the embodiment shown, the total current on the surface of dish 22 is approximately five and one half (5.5) milliamps, which represents the primary flux-producing region of the surface of iron dish 22. A method for determining the shape of the contoured surfaces of iron dish 22 herein can perhaps best be appreciated with reference to FIG. 4.

Figure 4:
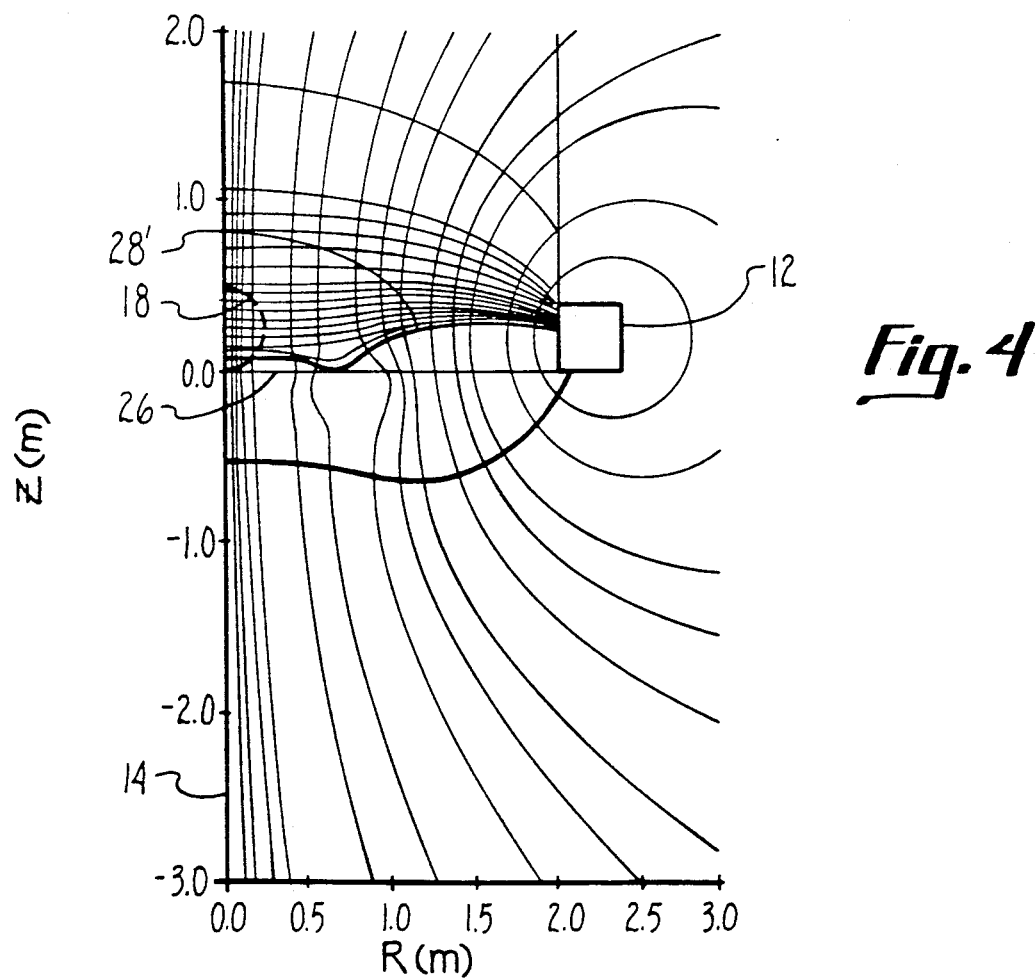
FIG. 4 is a flux plot diagram showing one-half of an axisymmetric system in accordance with the present invention.

In particular, FIG. 4 shows a plot of magnetic potential and magnetic field lines for the preferred embodiment of magnet system 10 using a single coil 12 and the iron dish insert 22. With cross-reference between FIG. 3 and FIG. 4, it is to be understood that reference plane 26 is located with regard to a coordinate system having a longitudinal axis (z coordinates), and a transverse axis (R coordinates) with plane 26 passing through the origin at z=0. Further, the R coordinates of the system indicate radial distances in meters from central longitudinal axis 14. With this coordinate system, the data shown on the axes of the graph in FIG. 4 includes z and R coordinate measurements measured in meters. Thus, R=0 corresponds to central axis 14. It is readily apparent that by locating ring coil 12 about dish 22 as shown in FIG. 4, the magnetic potential lines generated by coil 12 are somewhat parallel to the various surface contours. By shaping top surface 28 along the potential contour line 28', in FIG. 4, there is generated a target zone 18 of uniform field. It is important to note that the magnet system 10 is operated so that iron dish 22 remains below saturation and is operable in a linear B-H regime, where B is magnetic flux density, and H is magnetic field intensity. It may also be seen that the distribution of the uniform field is centered at approximately two tenths (0.2) meters above reference plane 26 in the embodiment illustrated.

In order to determine a solution to arrive at the appropriate surface contour of dish 22, a computer model is used to generate a magnetic configuration with all magnetic sources located generally below plane 26, and with the target volume essentially located above plane 26. A design which is axisymmetric, while not required, is easiest to analyze. In particular, the following equations can be used to describe the radial and axial magnetic fields, $B_r$ and $B_z$ respectively, $$B_r = \sum_{N=1}^{\infty} a_N \lambda^{N-2} \left(\frac{r}{c\zeta}\right)^{N-1} \frac{3\rho(1+\zeta)}{[(1+\zeta)^2 + \rho^2]^{5/2}}$$

$$B_z = \sum_{N=1}^{\infty} a_N \lambda^{N-2} \left(\frac{r}{c\zeta}\right)^{N-1} \frac{-\rho^2 - 2(1+\zeta)^2}{[(1+\zeta)^2 + \rho^2]^{5/2}}$$

This is a standard mathematical representation of magnetic fields in a vacuum region known as a multipole expansion. The radial coordinate, R, has been scaled by $R = \lambda \rho$ and the axial coordinate, z, has been scaled by $z = \lambda \zeta$, where $\lambda$ is a scale factor which will determine the overall size of the system. A finite number of the coefficients $a_N$ are chosen, using standard mathematical techniques, to produce a uniform magnetic field in the region around $\zeta = 0$ and $\rho = 0$. These coefficients can be used to determine the magnetic sources (current-carrying coils or permanent magnets) which are located generally below plane 26.

While the particular magnet system for use in magnetic resonance imaging as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

I claim:

1. A magnet system used for magnetic resonance imaging of an object, comprising:
   means for establishing a magnetic field, said establishing means defining a central plane; and
   a contoured insert of ferromagnetic material positioned within said establishing means, said insert being substantially dish-shaped and having a front surface contoured to influence said establishing means and create a uniform magnetic field within a target sphere, said target sphere having a portion thereof distanced from said front surface of sufficient size to pass through part of said object positioned on said front surface for imaging said part of said object.

2. A magnet system used for magnetic resonance imaging of an object as recited in claim 1, wherein said establishing means is a coil.

3. A magnet system used for magnetic resonance imaging of an object as recited in claim 1, wherein said establishing means comprises permanent magnets.

4. A magnet system used for magnetic resonance imaging of an object as recited in claim 1, wherein said establishing means comprises permanent magnets in combination with a coil.

5. A magnet system used for magnetic resonance imaging of an object as recited in claim 1, wherein said front surface has a cross-sectional contour substantially coinciding with magnetic potential lines emanated by said coil across said front surface substantially parallel said central plane.

6. A magnet system used for magnetic resonance imaging of an object as recited in claim 5, wherein said insert is substantially cylindrical and has a radius approximately four times its thickness.

7. A magnet system used for magnetic resonance imaging of an object as recited in claim 6, wherein said coil is energized to provide a 0.5 tesla field at a central longitudinal axis of said coil.

8. A magnet system used for magnetic resonance imaging of an object as recited in claim 1, wherein said front surface is characterized by a contour which transitions from its center radially outwardly from a central flat portion to an intermediate concave portion to a peripheral convex portion.

9. A magnet system used for magnetic resonance imaging of an object as recited in claim 8, wherein said insert further comprises a bottom surface characterized by a flat portion and a convex portion radially extending therefrom, said flat portion of said bottom surface being substantially parallel to said central flat portion of said front surface.

10. A magnet system used for magnetic resonance imaging of an object as recited in claim 8, wherein said coil has a major radius about a central axis of about 2.2 meters.

11. A magnet system used for magnetic resonance imaging of an object as recited in claim 9, wherein said dish is made of iron.

12. A magnet system used for magnetic resonance imaging, comprising:
    a ring coil energizable to generate a magnetic field, said coil defining a plane; and
    a ferromagnetic dish positioned substantially parallel to said plane within said coil, said dish having a contoured front surface including a central flat circular portion, an annular convex portion, and an annular concave portion between said flat portion and said convex portion to influence said magnetic field of said coil to establish a sphere with a uniform magnetic field substantially above said flat portion.

13. A magnet system used for magnetic resonance imaging as recited in claim 12, wherein said coil is a superconducting coil.

14. A magnet system used for magnetic resonance imaging as recited in claim 12, wherein said dish is iron.

15. A magnet system used for magnetic resonance imaging as recited in claim 12, wherein said dish is axisymmetric.

16. A method for generating a uniform magnetic field adjacent a substantially dish-shaped ferromagnetic member, comprising the steps of:

positioning a coil about a periphery of said iron dish;
shaping a front surface of said dish to influence flux lines generated by energizing said coil; and
energizing said coil to generate potential lines above said top surface to establish a sphere having a substantially uniform magnetic field.

17. A method for generating a uniform magnetic field adjacent a substantially dish-shaped iron member as recited in claim 16, further comprising the step of providing a convoluted concave portion on said top surface in a circular pattern about the central axis of said dish, at a distance from said central axis of between 0.3 to 0.5 of the radius of said dish.

18. A method for generating a uniform magnetic field adjacent a substantially dish-shaped iron member as recited in claim 16, wherein said coil is energized sufficient to produce a 0.5 tesla field at said central axis.

* * * * *